(12) United States Patent
Murakami (10) Patent No.: US 12,418,984 B2
(45) Date of Patent: Sep. 16, 2025

(54) WIRING BOARD AND SEMICONDUCTOR DEVICE

(71) Applicant: SHINKO ELECTRIC INDUSTRIES CO., LTD., Nagano (JP)

(72) Inventor: Masahiro Murakami, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 455 days.

(21) Appl. No.: 17/935,634

(22) Filed: Sep. 27, 2022

(65) Prior Publication Data

US 2023/0106626 A1    Apr. 6, 2023

(30) Foreign Application Priority Data

Oct. 4, 2021   (JP) .................................. 2021-163527

(51) Int. Cl.
H05K 1/16    (2006.01)
H05K 1/02    (2006.01)
H05K 1/11    (2006.01)

(52) U.S. Cl.
CPC ........... H05K 1/165 (2013.01); H05K 1/0298 (2013.01); H05K 1/113 (2013.01); H05K 2201/086 (2013.01); H05K 2201/096 (2013.01)

(58) Field of Classification Search
CPC ...................................... H05K 1/165
USPC ......................................................... 174/250
See application file for complete search history.

(56) References Cited

U.S. PATENT DOCUMENTS

| 9,837,208 B2* | 12/2017 | Nakao ..................... H01F 17/04 |
| 11,749,444 B2* | 9/2023 | Kodama ............ H01F 17/0013 336/200 |
| 2014/0118976 A1* | 5/2014 | Yoshikawa ......... H01L 23/5384 361/761 |
| 2015/0200050 A1 | 7/2015 | Nakao et al. |
| 2019/0385777 A1 | 12/2019 | Kodama et al. |

FOREIGN PATENT DOCUMENTS

| JP | 2015-135870 | 7/2015 |
| JP | 2019-220504 | 12/2019 |
| JP | 2020-178097 | 10/2020 |

OTHER PUBLICATIONS

Office Action mailed on Feb. 25, 2025 with respect to the corresponding Japanese patent application No. 2021-163527.

* cited by examiner

Primary Examiner — Timothy J Thompson
(74) Attorney, Agent, or Firm — IPUSA, PLLC

(57) ABSTRACT

A wiring board includes an interconnect structure. The interconnect structure includes a pad, an insulating layer covering the pad, a magnetic resin disposed on the pad in the insulating layer, and a via interconnect penetrating the magnetic resin and electrically connected to the pad.

10 Claims, 9 Drawing Sheets

WIRING BOARD AND SEMICONDUCTOR DEVICE

CROSS-REFERENCE TO RELATED APPLICATIONS

This application is based upon and claims priority to Japanese Patent Application No. 2021-163527, filed on Oct. 4, 2021, the entire contents of which are incorporated herein by reference.

FIELD

Certain aspects of the embodiments discussed herein are related to circuit boards, semiconductor devices, and methods for manufacturing circuit boards.

BACKGROUND

Wiring boards with built-in inductors are known. An example of such a wiring board includes a core substrate having an opening formed therein, a magnetic resin filling the opening and having a through hole, and a plating film formed inside the through hole, for example. In this wiring board, an inductor is formed by the magnetic resin filling the opening in the core substrate, and the plating film formed inside the through hole in the magnetic resin. A wiring board of this type is proposed in Japanese Laid-Open Patent Publication No. 2019-220504, for example.

However, according to a method of forming the inductor inside the core substrate as in the case of the proposed wiring board described above, it is difficult to finely vary an inductance value of the inductor because the core substrate is thick.

SUMMARY

It is one object of the embodiments to provide a wiring board that can easily vary the inductance value.

According to one aspect of the embodiments, a wiring board includes an interconnect structure including a pad, an insulating layer covering the pad, a magnetic resin disposed on the pad in the insulating layer, and a via interconnect penetrating the magnetic resin and electrically connected to the pad.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Preferred embodiments of the present invention will be described with reference to the accompanying drawings. In the drawings, those parts that are the same are designated by the same reference numerals, and a repeated description of the same parts may be omitted.

A description will now be given of a wiring board, a semiconductor device, and a method for manufacturing the wiring board according to each embodiment of the present invention.

First Embodiment

[Configuration of Wiring Board]

Figure 1A:
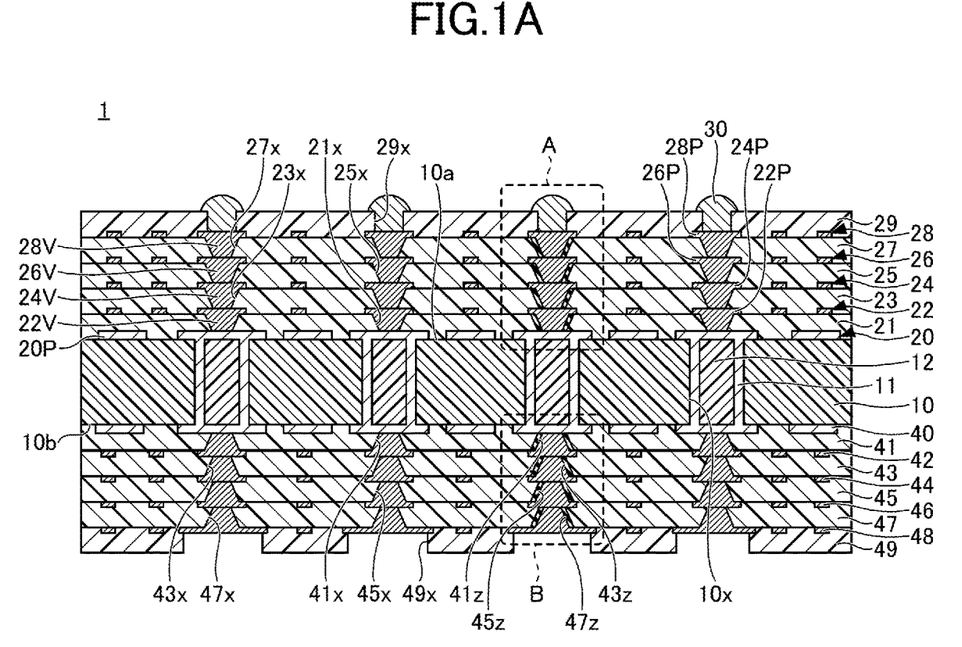
FIG. 1A and FIG. 1B are diagrams illustrating an example of a wiring board according to a first embodiment.
Figure 1B:
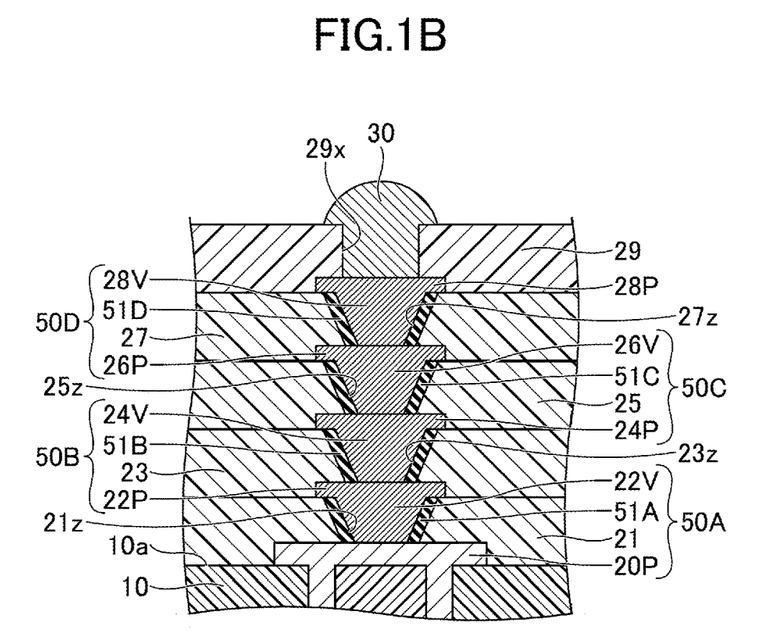

FIG. 1A and FIG. 1B are diagrams illustrating an example of the wiring board according to the first embodiment. FIG. 1A is a cross sectional view of the wiring board, and FIG. 1B is an enlarged view of a portion A illustrated in FIG. 1A. As illustrated in FIG. 1A and FIG. 1B, a wiring board 1 is a multi-layer wiring board in which an interconnect layer and an insulating layers are laminated on both surfaces, that is, mutually opposite surfaces of a core layer 10.

More particularly, in the wiring board 1, an interconnect layer 20, an insulating layer 21, an interconnect layer 22, an insulating layer 23, an interconnect layer 24, an insulating layer 25, an interconnect layer 26, an insulating layer 27, an interconnect layer 28, and a solder resist layer 29 are successively laminated on one surface 10a of the core layer 10. In addition, an interconnect layer 40, an insulating layer 41, an interconnect layer 42, an insulating layer 43, an interconnect layer 44, an insulating layer 45, an interconnect layer 46, an insulating layer 47, an interconnect layer 48, and a solder resist layer 49 are successively laminated on the other surface 10b of the core layer 10, opposite to the one surface 10a. A laminated structure on the one surface 10a of the core layer 10, and the laminated structure on the other surface 10b of the core layer 10, are approximately symmetrical with respect to the core layer 10.

In present embodiment, for the sake of convenience, one side of the wiring board 1 having the solder resist layer 29 may also be referred to as an upper side, and the other side of the wiring board 1 having the solder resist layer 49 may also be referred to as a lower side. Moreover, a surface of each portion located on the one side of the wiring board 1 having the solder resist layer 29 may also be referred to as one surface or a top surface. A surface of each portion located on the other side of the wiring board 1 having the solder resist layer 49 may also be referred to as the other surface or a bottom surface. However, the wiring board 1 may be used in an upside-down state, or at an inclined state inclined at an arbitrary angle. A plan view of an object refers to a view of the object viewed in a normal direction with respect to the one surface 10a of the core layer 10, and a planar shape of the object refers to a shape of the object in the plan view viewed in the normal direction with respect to the one surface 10a of the core layer 10.

For example, a so-called glass epoxy substrate or the like having a glass cloth impregnated with an insulating resin, such as an epoxy-based resin or the like, may be used for the core layer 10. A substrate or the like having a woven or non-woven fabric, such as glass fibers, carbon fibers, aramid fibers, or the like, impregnated with an epoxy-based resin, a polyimide-based resin, or the like, may be used for the core layer 10. The core layer 10 may have a thickness in a range of approximately 60 μm to approximately 400 μm, for example. The core layer 10 is provided with through holes 10x penetrating the core layer 10 in a thickness direction thereof. The planar shape of the through hole 10x may be circular, for example.

A through interconnect 11 is provided to cover an inner wall defining the through hole 10x in the core layer 10. A resin 12 fills an inside of the through interconnect 11. The through interconnect 11 may fill the inside of the through hole 10x. In this case, the resin 12 may be omitted. A material used for the through interconnect 11 may be copper (Cu) or the like, for example. A material used for the resin 12 may be an insulating resin or the like including an epoxy-based resin as a main component thereof, for example.

The interconnect layer 20 is formed on the one surface 10a of the core layer 10. The interconnect layer 20 includes pads 20P and interconnect patterns. On the other hand, the interconnect layer 40 is formed on the other surface 10b of the core layer 10. The interconnect layer 40 includes pads and interconnect patterns. The interconnect layer 20 and the interconnect layer 40 are electrically connected via the through interconnect 11. The interconnect layers 20 and 40 are patterned into predetermined planar shapes, respectively. A material used for the interconnect layers 20 and 40 may be copper (Cu) or the like, for example. The interconnect layers 20 and 40 may have a thickness in a range of approximately 10 μm to approximately 30 μm, for example. The interconnect layer 20, the interconnect layer 40, and the through interconnect 11 may be integrally formed.

The insulating layer 21 is formed on the one surface 10a of the core layer 10, so as to cover the interconnect layer 20. A material used for the insulating layer 21 may be an insulating resin or the like including an epoxy-based resin or a polyimide-based resin as a main component thereof, for example. The insulating layer 21 may have a thickness in a range of approximately 20 μm to approximately 30 μm, for example. The thickness of the insulating layer 21 described herein refers to a distance from a top surface of the interconnect layer 20 to a top surface of the insulating layer 21. The same applies to thicknesses of insulating layers or the like described hereinafter. The insulating layer 21 may include a filler, such as silica ($SiO_2$) or the like. A filler content in the insulating layer 21 may be suitably set according to the required coefficient of thermal expansion (CTE).

The interconnect layer 22 is formed on one side of the insulating layer 21. The interconnect layer 22 includes via interconnects 22V that fill via holes 21x penetrating the insulating layer 21 and exposing top surfaces of the pads 20P, pads 22P formed on the top surface of insulating layer 21, and interconnect patterns. In addition, the interconnect layer 22 includes via interconnects 22V filling via holes 21z penetrating a magnetic resin 51A and exposing the top surfaces of the pads 20P, and pads 22P formed on the top surface of the insulating layer 21 and a top surface of the magnetic resin 51A. The pad 22P is electrically connected to the pad 20P via the via interconnect 22V. Each of the via holes 21x and 21z may be a cavity having an inverted truncated cone shape, and a diameter of an opening of the cavity at one end which opens to the insulating layer 23 is greater than a diameter of an opening of the cavity at the other end (that is, a bottom surface of the cavity) formed by the top surface of the pad 20P. A material used for the interconnect layer 22, and a thickness of the interconnect patterns of the interconnect layer 22, may be similar to those of the interconnect layer 20, for example.

The insulating layer 23 is formed on the top surface of the insulating layer 21, so as to cover the interconnect layer 22. A material used for the insulating layer 23, and a thickness of the insulating layer 23, may be similar to those of the insulating layer 21, for example. The insulating layer 23 may include a filler, such as silica ($SiO_2$) or the like. A filler content in the insulating layer 23 may be similar to that of the insulating layer 21, for example.

The interconnect layer 24 is formed on one side of the insulating layer 23. The interconnect layer 24 includes via interconnects 24V that fill via holes 23x penetrating the insulating layer 23 and exposing the top surfaces of the pads 22P, pads 24P formed on the top surface of insulating layer 23, and interconnect patterns. In addition, the interconnect layer 24 includes via interconnects 24V that fill via hole 23z penetrating a magnetic resin 51B and exposing the top surfaces of the pads 22P, and pads 24P formed on a top surface of the insulating layer 23 and a top surface of the magnetic resin 51B. The pad 24P is electrically connected to the pad 22P via the via interconnect 24V. Each of the via holes 23x and 23z may be a cavity having an inverted truncated cone shape, and a diameter of an opening of the cavity at one end which opens to the insulating layer 25 is greater than a diameter of an opening of the cavity at the other end (that is, a bottom surface of the cavity) formed by the top surface of the pad 22P. A material used for the interconnect layer 24, and a thickness of the interconnect patterns of the interconnect layer 24, may be similar to those of the interconnect layer 20, for example.

The insulating layer 25 is formed on the top surface of the insulating layer 23, so as to cover the interconnect layer 24. A material used for the insulating layer 25, and a thickness of the insulating layer 25, may be similar to those of the insulating layer 21, for example. The insulating layer 25 may include a filler, such as silica ($SiO_2$) or the like. A filler content in the insulating layer 25 may be similar to that of the insulating layer 21, for example.

The interconnect layer 26 is formed on one side of the insulating layer 25. The interconnect layer 26 includes via interconnects 26V that fill via holes 25x penetrating the insulating layer 25 and exposing top surfaces of the pads 24P, pads 26P formed on a top surface of the insulating layer 25, and interconnect patterns. In addition, the interconnect layer 26 includes via interconnects 26V that fill via holes 25z penetrating a magnetic resin 51C and exposing the top surfaces of the pads 24P, and pads 26P formed on the top surface of the insulating layer 25 and a top surface of the magnetic resin 51C. The pad 26P is electrically connected to the pad 24P via the via interconnect 26V. Each of the via holes 25x and 25z may be a cavity having an inverted truncated cone shape, and a diameter of an opening of the cavity at one end which opens to the insulating layer 27 is greater than a diameter of an opening of the cavity at the other end (that is, a bottom surface of the cavity) formed by the top surface of the pad 24P. A material used for the interconnect layer 26, and a thickness of the interconnect patterns of the interconnect layer 26, may be similar to those of the interconnect layer 20, for example.

The insulating layer 27 is formed on the top surface of the insulating layer 25, so as to cover the interconnect layer 26. A material used for the insulating layer 27, and a thickness of the insulating layer 27, may be similar to those of the insulating layer 21, for example. The insulating layer 27 may include a filler, such as silica ($SiO_2$) or the like. The filler content in the insulating layer 27 may be similar to that of the insulating layer 21, for example.

The interconnect layer 28 is formed on one side of the insulating layer 27. The interconnect layer 28 includes via interconnects 28V that fill via holes 27x penetrating the insulating layer 27 and exposing the top surfaces of the pads 26P, pads 28P formed on a top surface of the insulating layer 27, and interconnect patterns. In addition, the interconnect layer 28 includes via interconnects 28V that fill via holes 27z penetrating a magnetic resin 51D and exposing the top surfaces of the pads 26P, and pads 28P formed on the top surface of the insulating layer 27 and a top surface of the magnetic resin 51D. The pad 28P is electrically connected to the pad 26P via the via interconnect 28V. Each of the via holes 27x and 27z may be a cavity having an inverted truncated cone shape, and a diameter of an opening of the cavity at one end which opens to the solder resist layer 29 is greater than a diameter of an opening of the cavity at the other end (that is, a bottom surface of the cavity) formed by the top surface of the pad 26P. A material used for the interconnect layer 28, and a thickness of the interconnect patterns of the interconnect layer 28, may be similar to those of the interconnect layer 20, for example.

The solder resist layer 29 is the outermost layer on the one side of the wiring board 1, and is formed on a top surface of the insulating layer 27, so as to cover the interconnect layer 28. The solder resist layer 29 may be formed of a photosensitive resin or the like, such as an epoxy-based resin, an acrylic-based resin, or the like, for example. The solder resist layer 29 may have a thickness in a range of approximately 15 μm to approximately 35 μm, for example.

The solder resist layer 29 has openings 29x, and portions of top surfaces of the pads 28P of the interconnect layer 28 are exposed at bottoms of the openings 29x, respectively. A planar shape of the opening 29x may be circular, for example. A metal layer may be formed on the top surfaces of the pads 28P exposed inside the openings 29x, or the top surfaces of the pads 28P exposed inside the openings 29x may be subjected to an antioxidation treatment, such as an Organic Solderability Preservative (OSP) treatment or the like, as appropriate. Examples of metal layer include an Au layer, a Ni/Au layer (a metal layer formed by laminating a Ni layer and a Au layer in this order), a Ni/Pd/Au layer (a metal layer formed by laminating a Ni layer, a Pd layer, and a Au layer in this order), or the like, for example.

External connection terminals 30 are formed on the top surfaces of the pads 28P exposed at the bottoms of the openings 29x, respectively. The external connection terminal 30 is a solder bump, for example. Examples of a material used for the solder bump include an alloy including Pb, an alloy of Sn and Cu, an alloy of Sn and Ag, an alloy of Sn, Ag, and Cu, or the like, for example. The external connection terminals 30 are terminals for making electrical connections to a semiconductor chip.

The insulating layer 41 is formed on the other surface 10b of the core layer 10, so as to cover the interconnect layer 40. A material used for the insulating layer 41, and a thickness of the insulating layer 41, may be similar to those of the insulating layer 21, for example. The insulating layer 41 may include a filler, such as silica ($SiO_2$) or the like. A filler content in the insulating layer 41 may be similar to that of the insulating layer 21, for example.

The interconnect layer 42 is formed on the other side of the insulating layer 41. The interconnect layer 42 includes via interconnects that fill via holes 41x penetrating the insulating layer 41 and exposing bottom surfaces of pads forming the interconnect layer 40, and interconnect patterns. In addition, the interconnect layer 42 includes via interconnects that fill via holes 41z penetrating a magnetic resin and exposing the bottom surfaces of the pads of the interconnect layer 40, and pads formed on a bottom surface of the insulating layer 41 and a bottom surface of the magnetic resin. The pad forming the interconnect layer 42 is electrically connected to the pad forming the interconnect layer 40, via a via interconnect. Each of the via holes 41x and 41z may be a cavity having an inverted truncated cone shape, and a diameter of an opening of the cavity at one end which opens to the insulating layer 43 is greater than a diameter of an opening of the cavity at the other end (that is, a bottom surface of the cavity) formed by the bottom surface of the pad forming the interconnect layer 40. A material used for the interconnect layer 42, and a thickness of the interconnect patterns of the interconnect layer 42, may be similar to those of the interconnect layer 20, for example.

The insulating layer 43 is formed on the bottom surface of the insulating layer 41, so as to cover the interconnect layer 42. A material used for the insulating layer 43, and a thickness of the insulating layer 43, may be similar to those of the insulating layer 21, for example. The insulating layer 43 may include a filler, such as silica ($SiO_2$) or the like. A filler content in the insulating layer 43 may be similar to that of the insulating layer 21, for example.

The interconnect layer 44 is formed on the other side of the insulating layer 43. The interconnect layer 44 includes via interconnects that fill via holes 43x penetrating the insulating layer 43 and exposing bottom surfaces of pads forming the interconnect layer 42, pads formed on a bottom surface of the insulating layer 43, and interconnect patterns. In addition, the interconnect layer 44 includes via interconnects that fill via holes 43z penetrating a magnetic resin and exposing the bottom surfaces of the pads of the interconnect layer 42, and pads formed on the bottom surface of the insulating layer 43 and a bottom surface of the magnetic resin. The pad forming the interconnect layer 44 is electrically connected to the pad forming the interconnect layer 42, via a via interconnect. Each of the via holes 43x and 43z may be a cavity having an inverted truncated cone shape, and a diameter of an opening of the cavity at one end which opens to the insulating layer 45 is greater than a diameter of an opening of the cavity at the other end (that is, a bottom surface of the cavity) formed by the bottom surface of the pad forming the interconnect layer 42. A material used for the interconnect layer 44, and a thickness of the interconnect patterns of the interconnect layer 44, may be similar to those of the interconnect layer 20, for example.

The insulating layer 45 is formed on the bottom surface of the insulating layer 43, so as to cover the interconnect layer 44. A material used for the insulating layer 45, and a thickness of the insulating layer 45, may be similar to those of the insulating layer 21, for example. The insulating layer 45 may include a filler, such as silica ($SiO_2$) or the like. A filler content in the insulating layer 45 may be similar to that of the insulating layer 21, for example.

The interconnect layer 46 is formed on the other side of the insulating layer 45. The interconnect layer 46 includes via interconnects that fill via holes 45x penetrating the insulating layer 45 and exposing bottom surfaces of pads forming the interconnect layer 44, pads formed on a bottom surface of the insulating layer 45, and interconnect patterns. In addition, the interconnect layer 46 includes via interconnects that fill via holes 45z penetrating a magnetic resin and exposing the bottom surfaces of the pads of the interconnect layer 44, and pads formed on the bottom surface of the insulating layer 45 and a bottom surface of the magnetic resin. The pad forming the interconnect layer 46 is electrically connected to the pad forming the interconnect layer 44, via a via interconnect. Each of the via holes 45x and 45z may be a cavity having an inverted truncated cone shape, and a diameter of an opening of the cavity at one end which opens to the insulating layer 47 is greater than a diameter of an opening of the cavity at the other end (that is, a bottom surface of the cavity) formed by the bottom surface of the pad forming the interconnect layer 44. A material used for the interconnect layer 46, and a thickness of the interconnect patterns of the interconnect layer 46, may be similar to those of the interconnect layer 20, for example.

The insulating layer 47 is formed on the bottom surface of the insulating layer 45, so as to cover the interconnect layer 46. A material used for the insulating layer 47, and a thickness of the insulating layer 47, may be similar to those of the insulating layer 21, for example. The insulating layer 47 may include a filler, such as silica ($SiO_2$) or the like. A filler content in insulating layer 47 may be similar to that of the insulating layer 21, for example.

The interconnect layer 48 is formed on the other side of the insulating layer 47. The interconnect layer 48 includes via interconnects that fill via holes 47x penetrating the insulating layer 47 and exposing bottom surfaces of pads forming the interconnect layer 46, pads formed on a bottom surface of insulating layer 47, and interconnect patterns. In addition, the interconnect layer 48 includes via interconnects that fill via holes 47z penetrating a magnetic resin and exposing bottom surfaces of the pads of the interconnect layer 46, and pads formed on the bottom surface of insulating layer 47 and a bottom surface of the magnetic resin. The pad forming the interconnect layer 48 is electrically connected to the pad forming the interconnect layer 46, via a via interconnect. Each of the via holes 47x and 47z may be a cavity having an inverted truncated cone shape, and a diameter of an opening of the cavity at one end which opens to the solder resist layer 49 is greater than a diameter of an opening of the cavity at the other end (that is, a bottom surface of the cavity) formed by the bottom surface of the pad forming the interconnect layer 46. A material used for the interconnect layer 48, and a thickness of the interconnect patterns of the interconnect layer 48, may be similar to those of the interconnect layer 20, for example.

The solder resist layer 49 is the outermost layer on the other side of the wiring board 1, and is formed on the bottom surface of insulating layer 47, so as to cover the interconnect layer 48. A material used for the solder resist layer 49, and a thickness of the solder resist layer 49, may be similar to those of the solder resist layer 29, for example. The solder resist layer 49 has openings 49x, and portions of bottom surfaces of the pads of the interconnect layer 48 are exposed at bottoms of the openings 49x, respectively. A planar shape of the opening 49x may be circular, for example. The pads of the interconnect layer 48 exposed inside the openings 49x may be used to make electrical connections to a mounting board (not illustrated), such as a motherboard or the like. A metal layer may be formed on the bottom surfaces of the pads exposed inside the openings 49x, or the bottom surfaces of the pads exposed inside the openings 49x may be subjected to an antioxidation treatment, such as the OSP treatment or the like, as appropriate.

As illustrated in FIG. 1B, the wiring board 1 includes interconnect structures 50A, 50B, 50C, and 50D that are successively laminated on the one surface 10a of the core layer 10. The wiring board 1 may include interconnect structures that are successively laminated on the other surface 10b of the core layer 10, in a region surrounded by a dashed line B in FIG. 1A. Because the interconnect structures in the region surrounded by the dashed line B corresponds to an up-side-down arrangement of the interconnect structures 50A through 50D in a region surrounded by a dashed line A, a description thereof will be omitted.

The interconnect structure 50A includes the pad 20P forming the interconnect layer 20, the insulating layer 21 covering the pad 20P, the magnetic resin 51A, and the via interconnect 22V forming the interconnect layer 22. The magnetic resin 51A is disposed on the pad 20P in the insulating layer 21. The via interconnect 22V is electrically connected to the pad 20P by penetrating the magnetic resin 51A. The magnetic resin 51A is formed to an annular shape in the plan view, so as to surround the via interconnect 22V. In other words, the magnetic resin 51A and the via interconnect 22V have coaxial structures. A thickness of the magnetic resin 51A is the same as a thickness of the via interconnect 22V. The thickness of each of the magnetic resin 51A and the via interconnect 22V may be in a range of approximately 20 µm to approximately 30 µm, for example.

The top surface of the magnetic resin 51A coincides with the top surface of the insulating layer 21, for example. This configuration facilitates forming the pad 22P on the top surface of the magnetic resin 51A and the top surface of the insulating layer 21. The top surface of the magnetic resin 51A makes contact with the bottom surface of the pad 22P. A bottom surface of the magnetic resin 51A makes contact with the top surface of the pad 20P. An inner wall surface of the magnetic resin 51A makes contact with an outer wall surface of the via interconnect 22V. In the cross sectional view, an outer wall surface of the magnetic resin 51A may be inclined in the same direction as the outer wall surface of the via interconnect 22V.

In a case where the planar shape of the via interconnect 22V is circular, a diameter of the via interconnect 22V on the side of the pad 22P may be in a range of approximately 40 µm to approximately 60 µm, for example, and the diameter of the via interconnect 22V on the side of the pad 20P may be in a range of approximately 25 µm to approximately 45 µm, for example. In this case, an outer diameter of the magnetic resin 51A on the side of the pad 22P may be in a range of approximately 90 µm to approximately 160 µm, for example, and the outer diameter of the magnetic resin 51A on the side of the pad 20P may be in a range of approximately 75 µm to approximately 145 µm, for example.

An inductor can be formed by the magnetic resin 51A and the via interconnect 22V. For example, an epoxy-based resin including magnetic particles may be used for the magnetic resin 51A. Examples of the magnetic particles include fillers, such as iron, iron oxide, cobalt iron oxide, silicon iron, magnetic alloys, ferrites, or the like, for example.

The interconnect structure 50B includes the pad 22P forming the interconnect layer 22, the insulating layer 23 covering the pad 22P, the magnetic resin 51B disposed on the pad 22P in the insulating layer 23, and the via interconnect 24V electrically connected to the pad 22P by penetrating the magnetic resin 51B.

The pad 22P of the upper interconnect structure 50B in an upper level is formed integrally with the via interconnect 22V of the interconnect structure 50A in a lower level, for example. In addition, the pad 22P of the upper interconnect structure 50B and the pad 20P of the lower interconnect structure 50A are electrically connected via the via interconnect 22V of the lower interconnect structure 50A. The interconnect structure 50B has a configuration identical to that of the interconnect structure 50A. A material used for the magnetic resin 51B may be the same as that of the magnetic resin 51A.

The interconnect structure 50C includes the pad 24P forming the interconnect layer 24, the insulating layer 25 covering the pad 24P, the magnetic resin 51C disposed on the pad 24P in the insulating layer 25, and the via interconnect 26V electrically connected to the pad 24P by penetrating the magnetic resin 51C.

The pad 24P of the upper interconnect structure 50C is formed integrally with the via interconnect 24V of the lower interconnect structure 50B, for example. In addition, the pad 24P of the upper interconnect structure 50C and the pad 22P of the lower interconnect structure 50B are electrically connected via the via interconnect 24V of the lower interconnect structure 50B. The interconnect structure 50C has a configuration identical to that of the interconnect structure 50A. A material used for the magnetic resin 51C may be the same as that of the magnetic resin 51A.

The interconnect structure 50D includes the pad 26P forming the interconnect layer 26, the insulating layer 27 covering the pad 26P, the magnetic resin 51D disposed on the pad 26P in the insulating layer 27, and the via interconnect 28V electrically connected to the pad 26P by penetrating the magnetic resin 51D.

The pad 26P of the upper interconnect structure 50D is formed integrally with the via interconnect 26V of the lower interconnect structure 50C, for example. The pad 26P of the upper interconnect structure 50D and the pad 24P of the lower interconnect structure 50C are electrically connected via the via interconnect 26V of the lower interconnect structure 50C. The interconnect structure 50D has a configuration identical to that of the interconnect structure 50A. A material used for the magnetic resin 51D may be the same as that of the magnetic resin 51A.

The pad 28P for external connection, electrically connected to the via interconnect 28V of the interconnect structure 50D, is disposed on the insulating layer 27 of the interconnect structure 50D in an uppermost level of the laminated structure. The pad 28P is formed integrally with the via interconnect 28V of the interconnect structure 50D, for example.

The via interconnect 22V of the interconnect structure 50A, the via interconnect 24V of the interconnect structure 50B, the via interconnects 26V of the interconnect structure 50C, and the via interconnect 28V of the interconnect structure 50D have portions that overlap one another in the plan view. In order to increase the inductance value, the via interconnect 22V of the interconnect structure 50A, the via interconnect 24V of the interconnect structure 50B, the via interconnect 26V of the interconnect structure 50C, and the via interconnect 28V of the interconnect structure 50D preferably overlap one another almost perfectly in the plan view. The almost perfect overlap refers to a state where common areas of the via interconnects of the interconnect structures 50A through 50D overlap in the plan view, and an area of each of the via interconnects of the interconnect structures 50A through 50D outside the respective common areas amount to 20% of a total area of each of the via interconnects in the plan view or less.

The magnetic resin 51A of the interconnect structure 50A, the magnetic resin 51B of the interconnect structure 50B, the magnetic resin 51C of the interconnect structure 50C, and the magnetic resin 51D of the interconnect structure 50D have portions overlapping one another in plan view. In order to increase the inductance value, the magnetic resin 51A of the interconnect structure 50A, the magnetic resin 51B of the interconnect structure 50B, the magnetic resin 51C of the interconnect structure 50C, and the magnetic resin 51D of the interconnect structure 50D overlap one another almost perfectly in the plan view. The almost perfect overlap refers to a state where common areas of the magnetic resins 51A through 51D of the interconnect structures 50A through 50D overlap in the plan view, and an area of each of the magnetic resins 51A through 51D outside the respective common areas amount to 20% of a total area of each of the magnetic resins 51A through 51D in the plan view or less.

Accordingly, the wiring board 1 includes the interconnect structure including the magnetic resin, and the via interconnect penetrating the magnetic resin. For this reason, because the inductor can be formed by the magnetic resin and the via interconnect, there is no need to externally connect an inductor component, and it is possible to reduce both the thickness and cost of the wiring board 1.

Moreover, although the wiring board 1 may include a single interconnect structure, a large inductance value can be obtained by laminating a plurality of interconnect structures. Further, because the number interconnect structures to be laminated, that is, the number of levels in which the interconnect structures are provided, can be determined arbitrarily in the wiring board 1, it is possible to improve the degree of freedom of design for obtaining the required inductance value.

An inductor can be formed by providing a through interconnect penetrating the magnetic resin in the core layer 10, but because the core layer 10 is relatively thick, it is difficult to finely vary the inductance value by design. On the other hand, the insulating layers laminated on the top and the bottom of the core layer 10 are thin compared to the core layer 10, and thus, the inductance value can easily be varied to a desired value by varying the number interconnect structures, that is, the number of levels in which the interconnect structures are provided.

[Method For Manufacturing Wiring Board]

The wiring board 1 can be manufactured by a well known build-up method. In this example, the method for manufacturing the wiring board 1 will be described with reference to processes (or steps) of forming the magnetic resin, using partial cross sectional views of peripheries of the magnetic resin corresponding to FIG. 1A or FIG. 1B. Although the method of forming the laminated structure on one side of the core layer 10 will be described in this example, the laminated structure on the other side of the core layer 10 can be formed in a similar manner, and thus, a description of the latter will be omitted. Further, in this example, the processes of manufacturing one wiring board is described. However, a plurality of parts respectively corresponding to the wiring boards may be formed simultaneously, and the plurality of parts may thereafter be singulated into individual wiring boards.

FIG. 2A through FIG. 4B are diagrams illustrating an example of manufacturing processes of the wiring board according to the first embodiment. First, in the process illustrated in FIG. 2A, the core layer 10 having the through interconnect 11 and the resin 12 formed thereon is prepared, and the interconnect layer 20, including the pads 20P and the interconnect patterns, is formed on the one surface 10a of the core layer 10. The material used for the interconnect layer 20 and the thickness of the interconnect layer 20 are as described above. The interconnect layer 20 may be formed using various interconnect forming methods, such as a semi-additive method, a subtractive method, or the like.

Figure 2A:
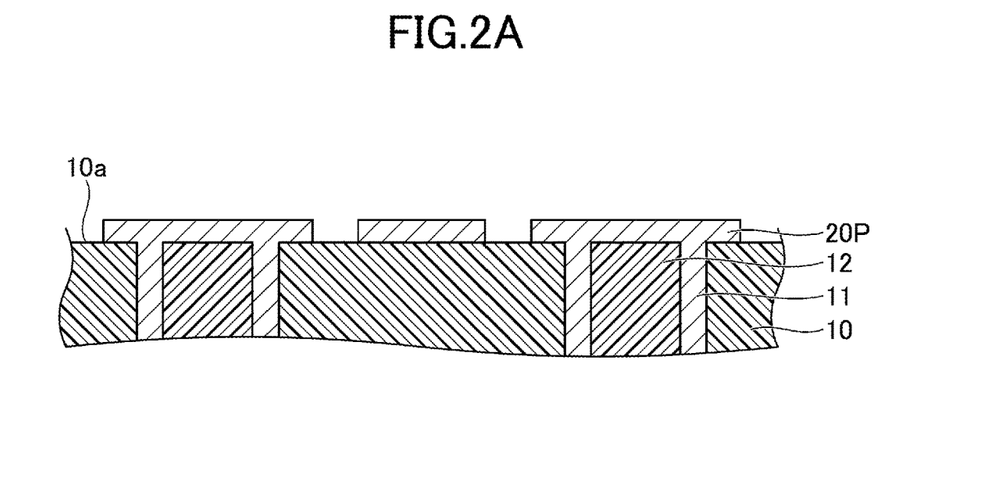
FIG. 2A, FIG. 2B, and FIG. 2C are diagrams (part 1) illustrating an example of manufacturing processes of the wiring board according to the first embodiment.
Figure 2B:
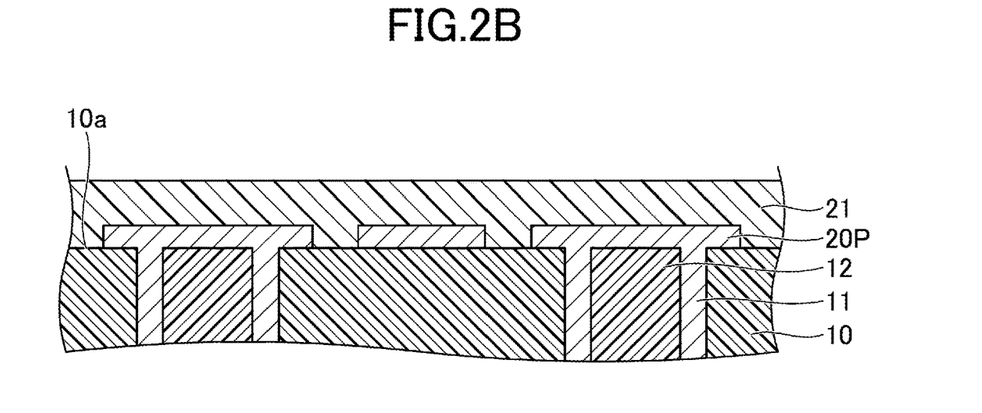

Next, in the process illustrated in FIG. 2B, a film of an epoxy-based resin or the like in a semi-cured state is laminated on the one surface 10a of the core layer 10, so as to cover the interconnect layer 20 including the pads 20P and the interconnect patterns, and this film is thereafter cured to form the insulating layer 21. Alternatively, a liquid or paste of the epoxy-based resin or the like is coted on the one surface 10a of the core layer 10, in place of the film of the epoxy-based resin or the like, and this liquid or paste is thereafter cured to form the insulating layer 21. The thickness or the like of the insulating layer 21 is as described above.

Figure 2C:
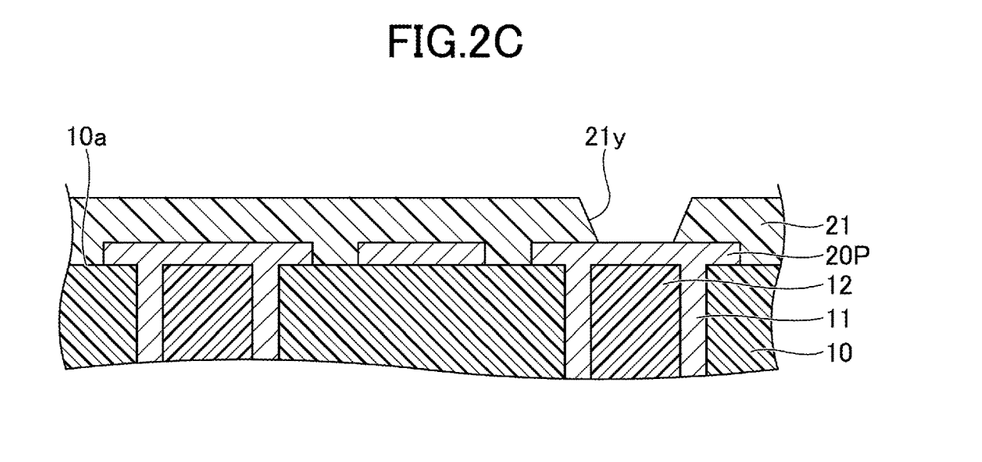

Next, in the process illustrated in FIG. 2C, through holes 21y, that penetrate the insulating layer 21 and expose the top surfaces of the pads 20P of the interconnect layer 20, are formed in the insulating layer 21. The through holes 21y are formed in regions where the magnetic resin 51A is to be formed at a subsequent process. The through holes 21y can be formed by a laser beam machining using a $CO_2$ laser or the like, for example.

Figure 3A:
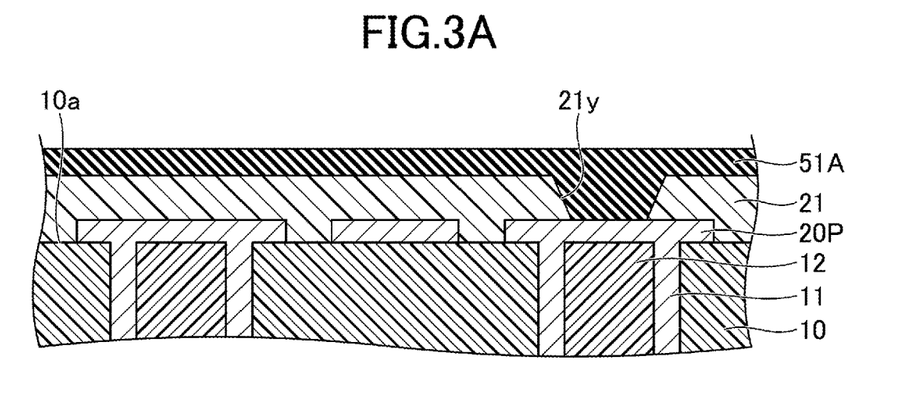
FIG. 3A, FIG. 3B, and FIG. 3C are diagrams (part 2) illustrating the example of the manufacturing processes of the wiring board according to the first embodiment.
Figure 3B:
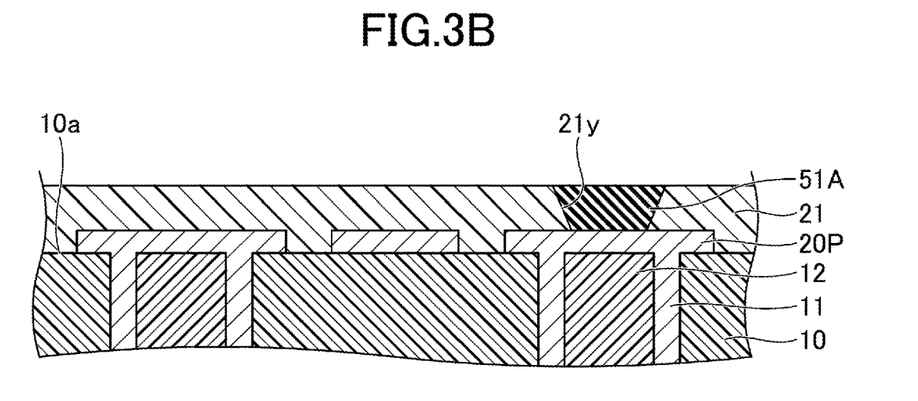

Next, in the processes illustrated in FIG. 3A and FIG. 3B, the magnetic resin 51A is formed to fill the through holes 21y. First, in the process illustrated in FIG. 3A, a paste of the thermosetting magnetic resin 51A is prepared, and a screen printing or the like is performed to fill the through holes 21y with this paste and cause this paste to protrude from the top surface of the insulating layer 21, for example. Thereafter, the magnetic resin 51A is heated and cured. The material used for the magnetic resin 51A is as described above. The magnetic resin 51A is preferably formed in a vacuum environment, in order to prevent entrapment of voids.

Next, in the process illustrated in FIG. 3B, the unwanted magnetic resin 51A protruding from the top surface of the insulating layer 21 is removed by polishing or the like. The unwanted magnetic resin 51A can be removed by buffing, roll grinding, or the like, for example. As a result of removing the unwanted magnetic resin 51A, the top surface of the magnetic resin 51A coincides with the top surface of the insulating layer 21, for example.

Figure 3C:
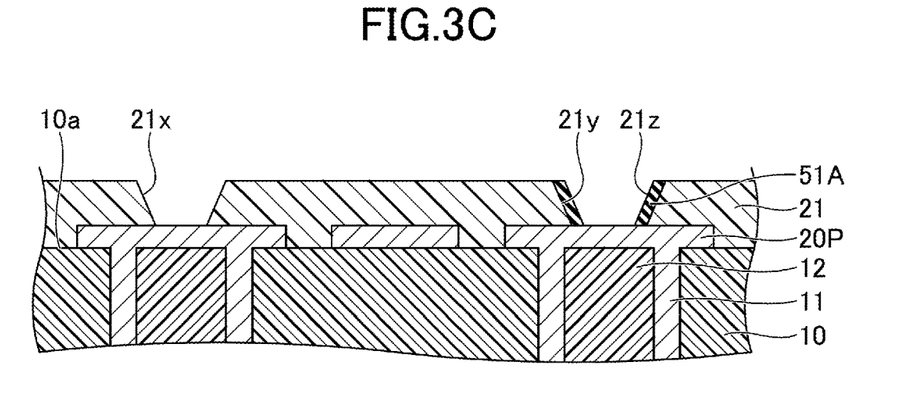

Next, in the process illustrated in FIG. 3C, the via holes 21x, penetrating the insulating layer 21 and exposing the top surfaces of the pads 20P, are formed in the insulating layer 21, respectively. In addition, the via holes 21z, penetrating the magnetic resin 51A and exposing the top surfaces of the pads 20P, respectively, are formed in the magnetic resin 51A. The via hole 21z is formed on the inner side the through hole 21y. The via holes 21x and 21z can be formed by a laser beam machining using a $CO_2$ laser or the like, for example. After forming the via holes 21x and 21z, a desmear process is performed to remove a resin residue adhered to the surfaces of the pads 20P that are exposed at the bottoms of the via holes 21x and 21z, respectively, as required.

Figure 4A:
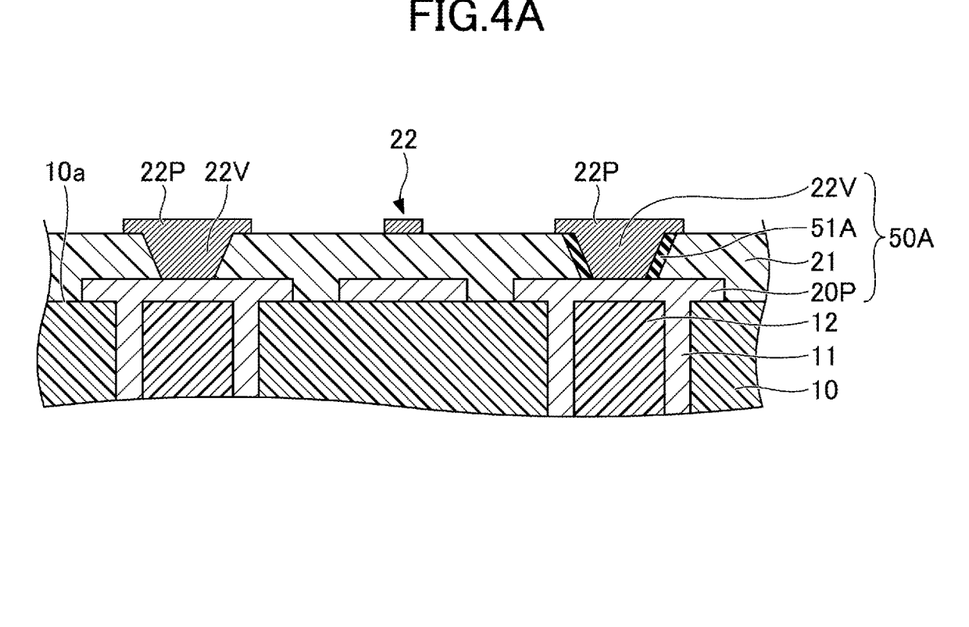
FIG. 4A and FIG. 4B are diagrams illustrating the example of the manufacturing processes of the wiring board according to the first embodiment.

Next, in the process illustrated in FIG. 4A, the interconnect layer 22 is formed on one side of the insulating layer 21. The interconnect layer 22 is formed to include the via interconnects 22V filling the via holes 21x and 21z, the pads 22P formed on the top surface of the insulating layer 21, and the interconnect patterns. However, the pads 22P on the interconnect structure 50A are formed on the top surface of the insulating layer 21 and on the top surface of the magnetic resin 51A. The material used for the interconnect layer 22, the thickness of the pads 22P and the interconnect patterns may be similar to those of the interconnect layer 20, for example. The pad 22P is electrically connected to the pad 20P via the via interconnect 22V. The interconnect structure 50A including the pads 20P, the insulating layer 21, the magnetic resin 51A, and the via interconnects 22V is formed by this process.

The interconnect layer 22 can be formed using various interconnect forming methods, such as the semi-additive method, the subtractive method, or the like. For example, when forming the interconnect layer 22 by the semi-additive method, a seed layer is formed by an electroless plating of copper or the like on the surface of the insulating layer 21 including the inner wall of the via hole 21x, the surface of the pad 20P exposed inside the via hole 21x, the surface of the magnetic resin 51A forming the inner wall of the via hole 21z, and the surface of the pad 20P exposed inside the via hole 21z. Next, a plating resist pattern, having openings in accordance with the shapes of the pads 22P and the interconnect patterns of the interconnect layer 22, is formed on the seed layer. Next, an electroplating layer is deposited on the seed layer exposed inside the openings in the plating resist pattern, by an electroplating of copper or the like using power supplied from the seed layer. Next, the plating resist pattern is removed, and an etching using the electroplating layer as a mask is performed to remove the seed layer exposed from the electroplating layer, thereby obtaining the interconnect layer 22.

Figure 4B:
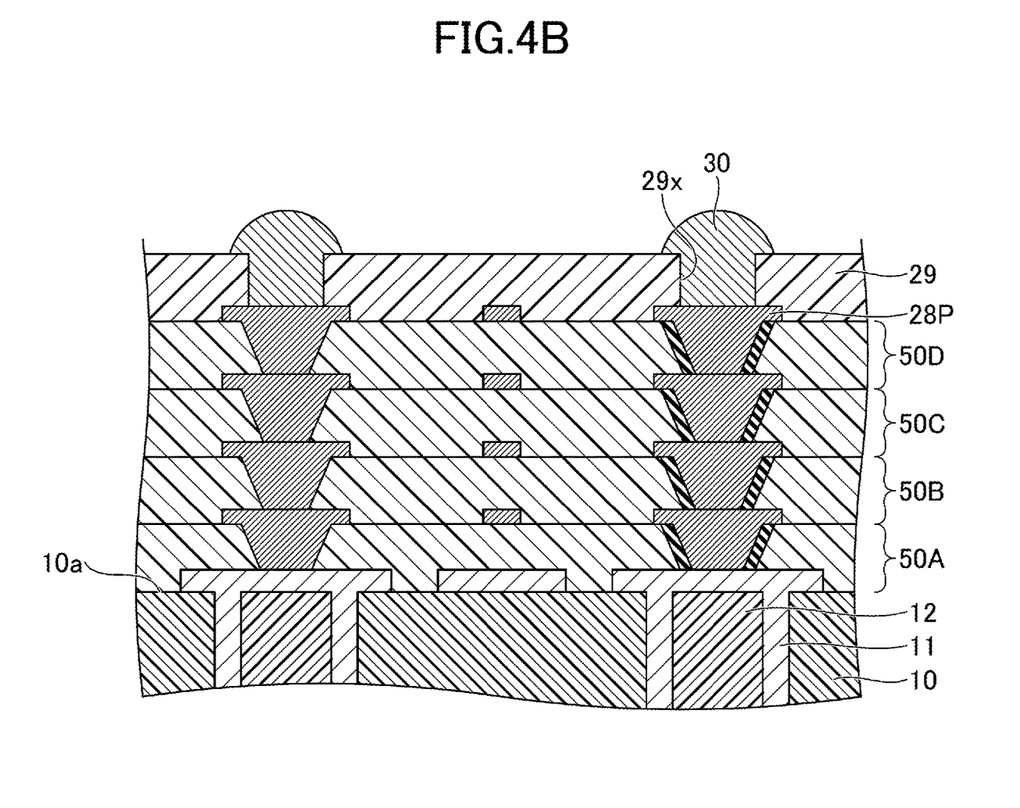

Next, in the process illustrated in FIG. 4B, processes similar to the processes described above in conjunction with FIG. 2B through FIG. 4A are repeated, to form the interconnect structures 50B through 50D, and the interconnect layer 28 including the pads 28P, on the interconnect structure 50A. Then, the solder resist layer 29 is formed on the interconnect structure 50D, so as to cover the interconnect layer 28 including the pads 28P. The solder resist layer 29 can be formed by coating a liquid or paste of a photosensitive epoxy-based insulating resin or acrylic-based insulating resin on the interconnect structure 50D by a screen printing, a roll coating, a spin coating, or the like, for example, so as to cover the interconnect layer 28. Alternatively, the solder resist layer 29 can be formed by laminating a film of a photosensitive epoxy-based insulating resin or acrylic-based insulating resin on the interconnect structure 50D, for example, so as to cover the interconnect layer 28.

Next, the solder resist layer 29 is exposed and developed, to form, by a photolithography technique, the openings 29x in the solder resist layer 29 that expose portions of the top surfaces of the pads 28P. The openings 29x may be formed by a laser beam machining or a blasting process. In such cases, the solder resist layer 29 does not need to be made of a photosensitive material. The planar shape of each of the openings 29x may be circular, for example. A diameter of each of the openings 29x can be designed arbitrarily according to a connection target.

In this process, the metal layer described above may be formed on the top surfaces of the pads 28P exposed at the bottoms of the openings 29x, by an electroless plating or the like, for example. Alternatively, the top surfaces of the pads 28P exposed at the bottoms of the openings 29x may be subjected to an antioxidation treatment, such as the OSP treatment or the like.

Next, the external connection terminals 30, such as solder bumps or the like, are formed on the top surfaces of the pads 28P exposed at the bottoms of the openings 29x. The external connection terminals 30 are the terminals for making electrical connections to the semiconductor chip.

First Modification of First Embodiment

A first modification of the first embodiment relates to an example of the wiring board having a protective insulating layer. In the first modification of the first embodiment, a description of the same constituent elements as those of the embodiment described above may be omitted.

[Configuration of Wiring Board]

Figure 5A:
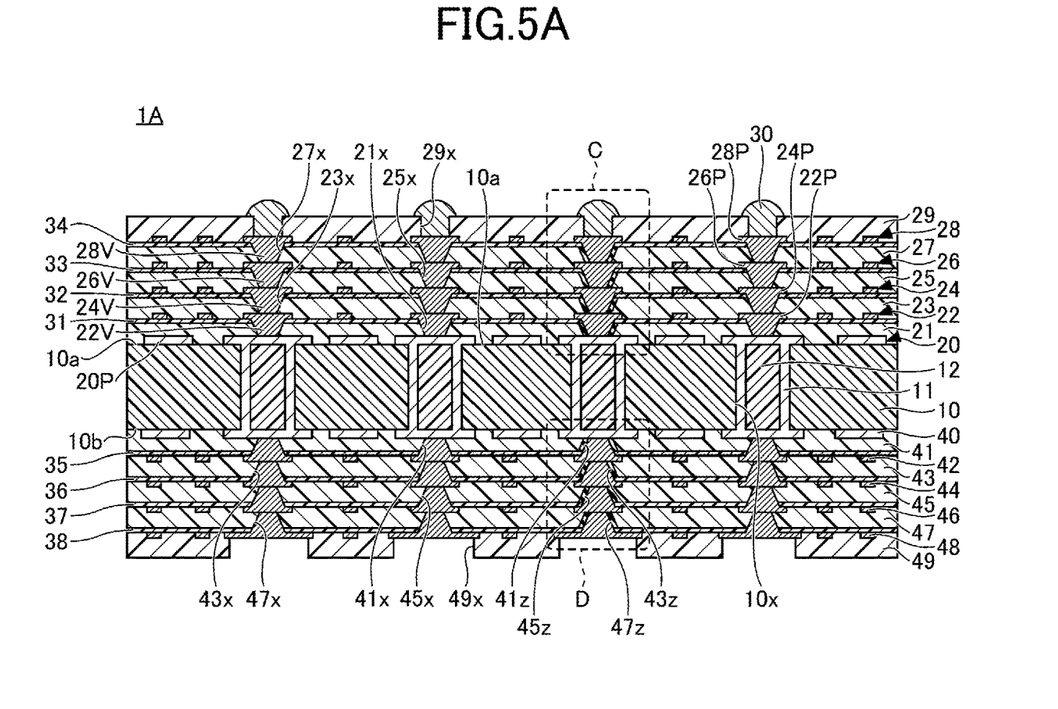
FIG. 5A and FIG. 5B are diagrams illustrating an example of the wiring board according to a first modification of the first embodiment.
Figure 5B:
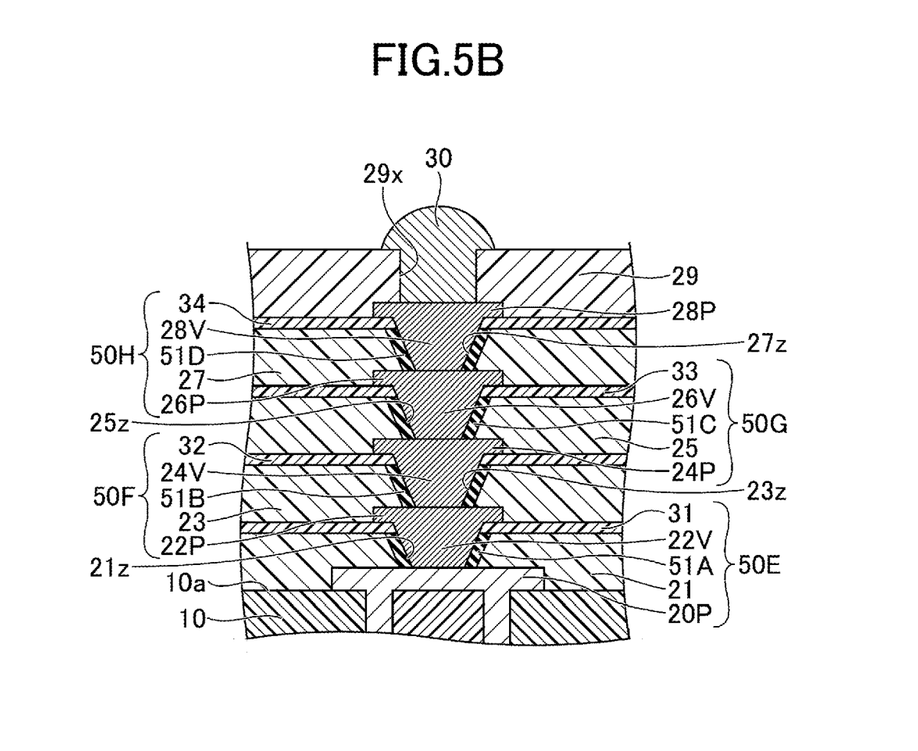

FIG. 5A and FIG. 5B are diagrams illustrating an example of the wiring board according to the first modification of the first embodiment. FIG. 5A is a cross sectional view of the wiring board, and FIG. 5B is an enlarged view of a portion C illustrated in FIG. 5A. As illustrated in FIG. 5A and FIG. 5B, a wiring board 1A differs from the wiring board 1 illustrated in FIG. 1A and FIG. 1B in that the protective insulating layer is laminated on each insulating layer.

More particularly, in the wiring board 1A, the interconnect layer 20, the insulating layer 21, the protective insulating layer 31, the interconnect layer 22, the insulating layer 23, a protective insulating layer 32, the interconnect layer 24, the insulating layer 25, a protective insulating layer 33, the interconnect layer 26, the insulating layer 27, a protective insulating layer 34, the interconnect layer 28, and the solder resist layer 29 are successively laminated on the one surface 10a of the core layer 10. On the other hand, the interconnect layer 40, the insulating layer 41, a protective insulating layer 35, the interconnect layer 42, the insulating layer 43, a protective insulating layer 36, the interconnect layer 44, the insulating layer 45, a protective insulating layer 37, the interconnect layer 46, the insulating layer 47, a protective insulating layer 38, the interconnect layer 48, and the solder resist layer 49 are successively laminated on the other surface 10b of the core layer 10. The laminated structure on the one surface 10a of the core layer 10, and the laminated structure on the other surface 10b, are approximately symmetrical with respect to the core layer 10.

Each insulating layer and the protective insulating layer laminated thereon function as an interlayer insulating layer (or interlayer dielectric) for insulating two mutually adjacent interconnect layers. Examples of a material used for each protective insulating layer include an insulating resin or the like including an epoxy-based resin or the like as a main component thereof, for example. The material used for each protective insulating layer may be the same as the material used for each insulating layer, or may be different from the material used for each insulating layer. Each protective insulating layer may have a thickness in a range of approximately 10 µm to approximately 15 µm, for example. In each interconnect structure, the protective insulating layer is preferably thinner than the insulating layer. The thinner the protective insulating layer, the thicker the magnetic resin can be made, thereby enabling a higher inductance value to be obtained per single interconnect structure.

As illustrated in FIG. 5B, the wiring board 1A includes interconnect structures 50E, 50F, 50G, and 50H successively laminated on the one surface 10a of the core layer 10. The wiring board 1A may include interconnect structures successively laminated on the other surface 10b of the core layer 10, in a region surrounded by a dashed line D in FIG. 5A. Because the interconnect structures in the region surrounded by the dashed line D corresponds to an up-side-down arrangement of the interconnect structures 50E through 50H in a region surrounded by a dashed line C, a description thereof will be omitted.

The interconnect structure 50E includes the pads 20P forming the interconnect layer 20, the insulating layer 21 covering the pads 20P, the protective insulating layer 31, the magnetic resin 51A, and the via interconnects 22V forming the interconnect layer 22. The protective insulating layer 31 continuously covers the top surface of the insulating layer 21 and the top surface of the magnetic resin 51A.

The magnetic resin 51A is disposed on the pads 20P in the insulating layer 21. The magnetic resin 51A penetrates the insulating layer 21, but does not penetrate the protective insulating layer 31. The top surface of the magnetic resin 51A is covered with the protective insulating layer 31, and the outer wall surface of the magnetic resin 51A is covered with the insulating layer 21.

The via interconnects 22V penetrate the protective insulating layer 31 and the magnetic resin 51A, and electrically connect to the pads 20P, respectively. The magnetic resin 51A is formed to an annular shape in the plan view, so as to surround the via interconnect 22V. In other words, the magnetic resin 51A and the via interconnect 22V have coaxial structures. A total thickness of the magnetic resin 51A and the protective insulating layer 31 is the same as the thickness of the via interconnect 22V.

Accordingly, the protective insulating layer may be laminated on each insulating layer, so as to function as the interlayer insulating layer (or interlayer dielectric) for insulating two mutually adjacent interconnect layers.

[Method for Manufacturing Wiring Board]

Manufacturing processes of the wiring board. 1A different from the manufacturing processes of the wiring board 1 will mainly be described.

FIG. 6A through FIG. 7B are diagrams illustrating the manufacturing processes of the wiring board according to the first modification of the first embodiment. First, processes similar to the processes of the first embodiment described above in conjunction with FIG. 2A through FIG. 3B are performed. Then, in the process illustrated in FIG. 6A, the protective insulating layer 31 is formed to continuously cover the top surface of the insulating layer 21 and the top surface of the magnetic resin 51A. The protective insulating layer 31 is formed by laminating a film of an epoxy-based resin or the like in the semi-cured state on the top surface of the insulating layer 21 and the top surface of the magnetic resin 51A, and thereafter curing this film, for example. Alternatively, the protective insulating layer 31 may be formed by coating a liquid or paste of the epoxy-based resin or the like on the top surface of the insulating layer 21 and the top surface of the magnetic resin 51A, in place of the film of the epoxy-based resin film or the like, and thereafter curing the liquid or paste. The thickness or the like of the protective insulating layer 31 may be as described above.

Figure 6A:
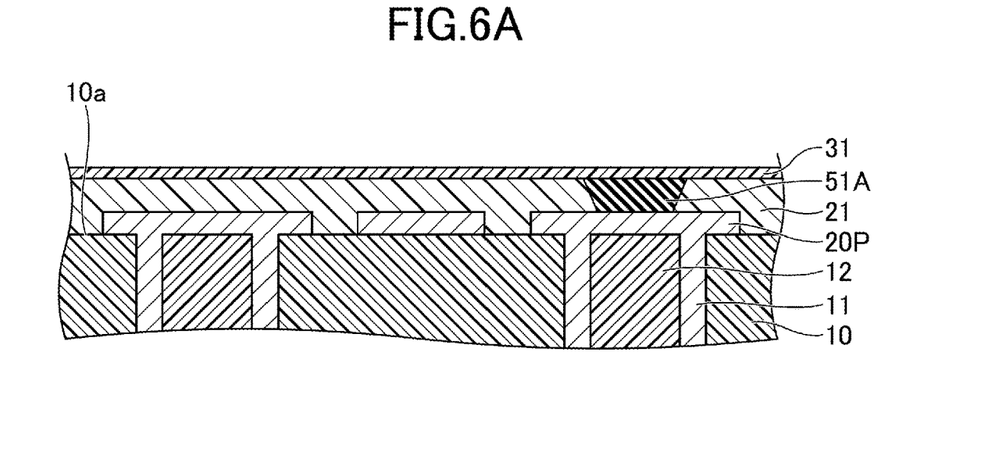
FIG. 6A, FIG. 6B, and FIG. 6C are diagrams (part 1) illustrating the manufacturing processes of the wiring board according to the first modification of the first embodiment.
Figure 6B:
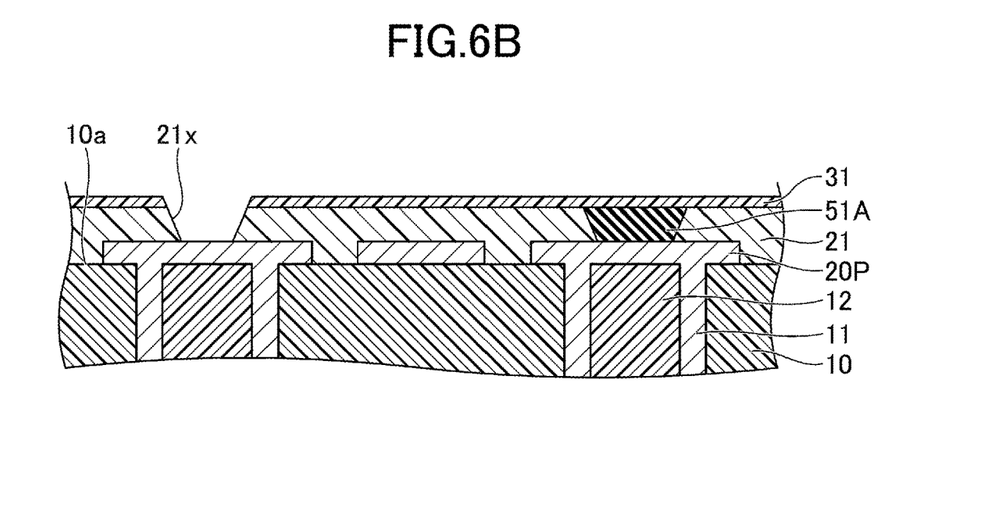

Next, in the process illustrated in FIG. 6B, the via holes 21x, penetrating the insulating layer 21 and the protective insulating layer 31 and exposing the top surfaces of the pads 20P, are formed in the insulating layer 21 and the protective insulating layer 31. The pads 20P forming the via holes 21x are located at the same level as the pads 20P forming the via holes 21z penetrating the protective insulating layer 31 and the magnetic resin 51A in the process illustrated in FIG. 6C, and are covered only with the insulating layer 21. In other words, the via holes 21x are formed to expose the pads having no magnetic resin 51A formed on the top surface thereof. The via holes 21x can be formed by a laser beam machining using a $CO_2$ laser or the like, for example. At this stage of the manufacturing process, via holes are not formed in the magnetic resin 51A. After forming the via holes 21x, a desmear process may be performed to remove the resin residue adhered to the surfaces of the pads 20P exposed at the bottoms of the via holes 21x. The removal of the resin residue in this process can be performed using a chemical, for example.

Figure 6C:
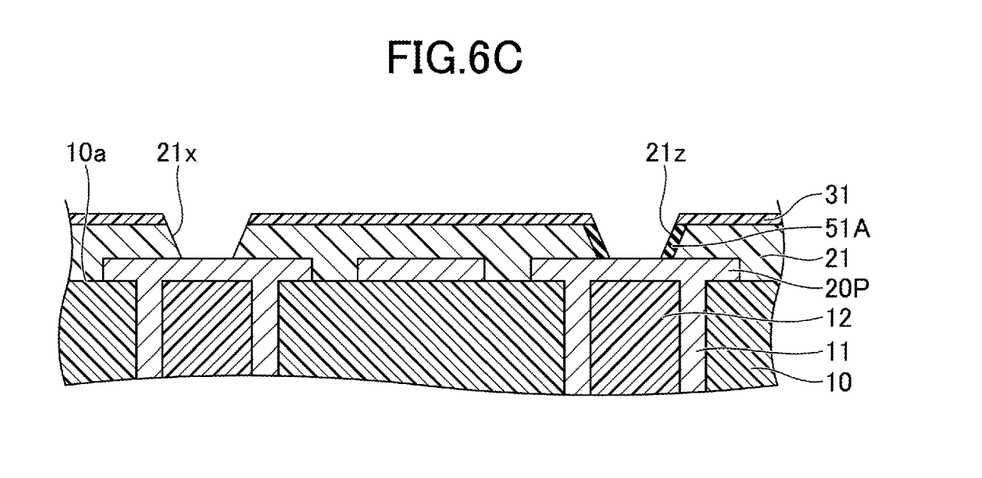

Next, in the process illustrated in FIG. 6C, the via holes 21z penetrating the protective insulating layer 31 and the magnetic resin 51A and exposing the top surfaces of the pads 20P, are formed in the protective insulating layer 31 and the magnetic resin 51A. The via holes 21z can be formed by a method similar that used to form the via holes 21x, for example. After forming the via holes 21z, the resin residue adhered to the surfaces of the pads 20P exposed at the bottoms of the via holes 21z may be removed. The removal of the resin residue in this process can be performed using a high-pressure water cleaning, for example.

Figure 7A:
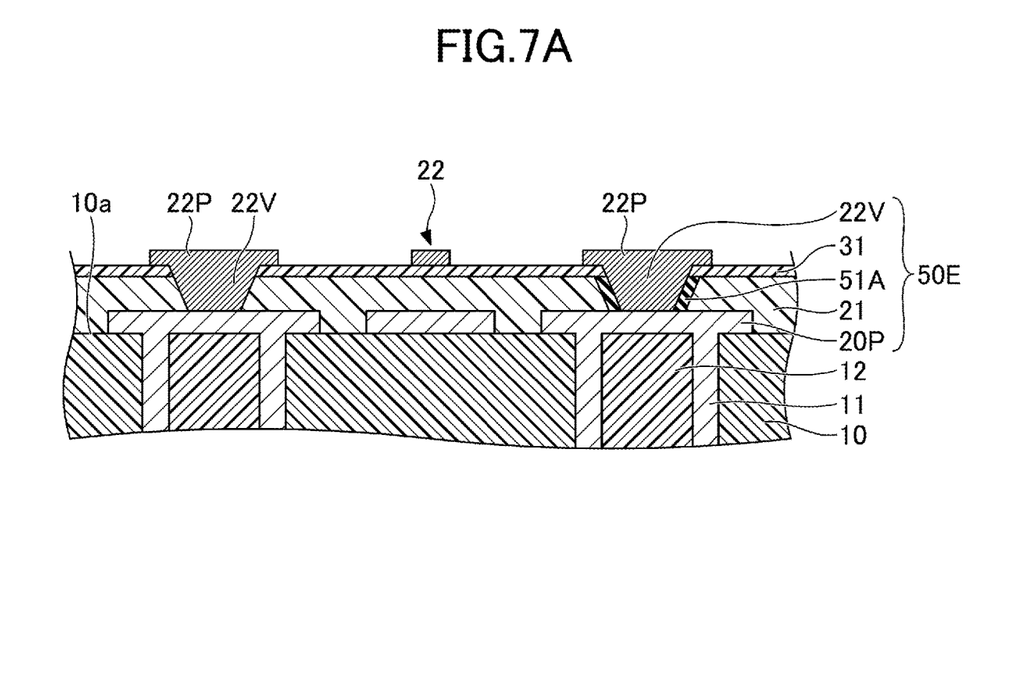
FIG. 7A and FIG. 7B are diagrams (part 2) illustrating the manufacturing processes of the wiring board according to the first modification of the first embodiment.

Next, in the process illustrated in FIG. 7A, the interconnect layer 22 is formed on one side of the protective insulating layer 31. The interconnect layer 22 is formed by the via interconnects 22V filling the via holes 21x and 21z, the pads 22P formed on the top surface of protective insulating layer 31, and the interconnect patterns. The material used for the interconnect layer 22, and the thickness of the pads 22P and the interconnect patterns, may be similar to those of the interconnect layer 20, for example. The pad 22P is electrically connected to the pad 20P via the via interconnect 22V. The interconnect structure 50E including the pads 20P, the insulating layer 21, the protective insulating layer 31, the magnetic resin 51A, and the via interconnects 22V, is formed by this process.

Figure 7B:
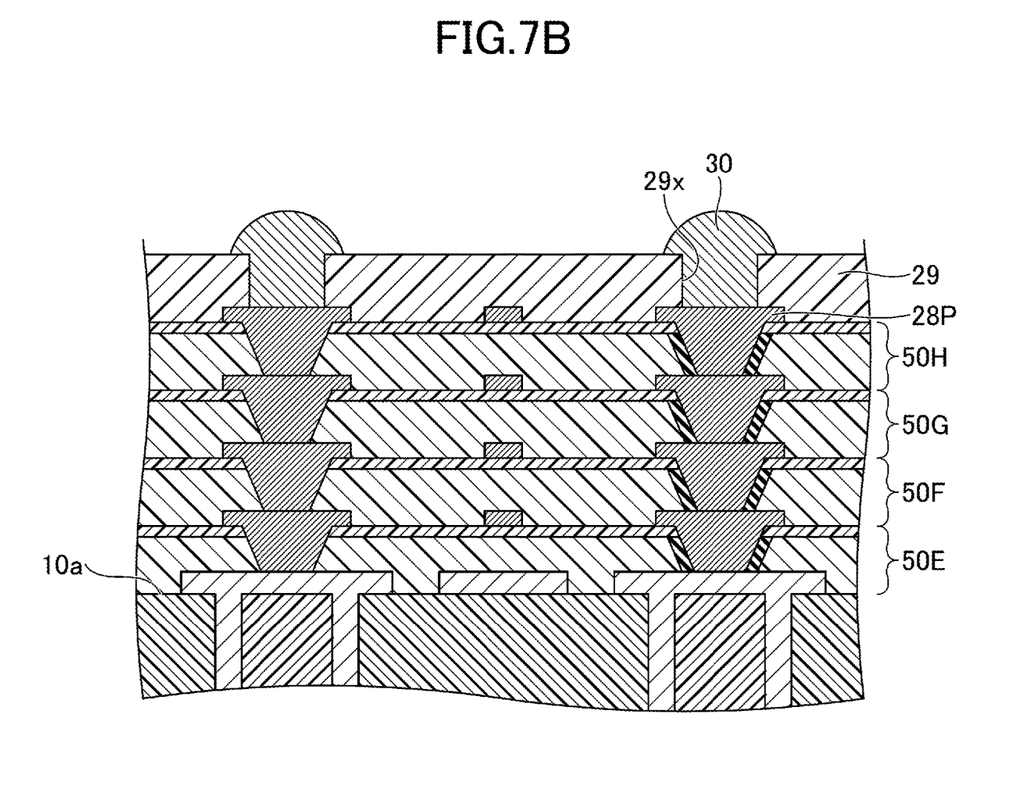

Next, in the process illustrated in FIG. 7B, steps similar to the steps described above in conjunction with FIG. 2B through FIG. 3B and FIG. 6A through FIG. 7A are repeated, to form the interconnect structures 50F through 50H and the interconnect layer 28 including the pads 28P on the interconnect structure 50E. Further, the solder resist layer 29 is formed on the interconnect structure 50H, so as to cover the interconnect layer 28 including the pads 28P.

Accordingly, in the manufacturing process of the wiring board 1A, the process of forming the via holes 21x and the process of removing the resin residue inside the via holes 21x are provided between the process of forming the protective insulating layer 31 (the process illustrated in FIG. 6A) and the process of forming the via holes 21z (process illustrated in FIG. 6C). For this reason, the removal of the resin residue inside the via holes 21x (process illustrated in FIG. 6B), and the removal of the resin residue inside the via holes 21z (process illustrated in FIG. 6C) can be performed independently of each other by selecting suitable methods therefor, respectively.

Generally, in a case where a chemical resistance of the magnetic resin 51A is low, and the resin residue is removed using a chemical, the magnetic resin 51A may become damaged by the chemical. However, in the manufacturing process of the wiring board 1A, the top surface of the magnetic resin 51A is covered with the protective insulating layer 31 in the process illustrated in FIG. 6B, and thus, even if the resin residue inside the via holes 21x is removed using the chemical, the chemical will not come into contact with the magnetic resin 51A. For this reason, it is possible to prevent the magnetic resin 51A from becoming damaged by the chemical used to remove the resin residue inside the via holes 21x. On the other hand, in FIG. 6C, it is possible to prevent damage to the magnetic resin 51A, because the resin residue in the via holes 21z can be removed by the high-pressure water cleaning, without using a chemical.

Second Modification of First Embodiment

A second modification of the first embodiment relates to an example of a coreless wiring board having no core layer. In the second modification of the first embodiment, a description of the same constituent elements as those of the embodiment described above may be omitted.

Figure 8:
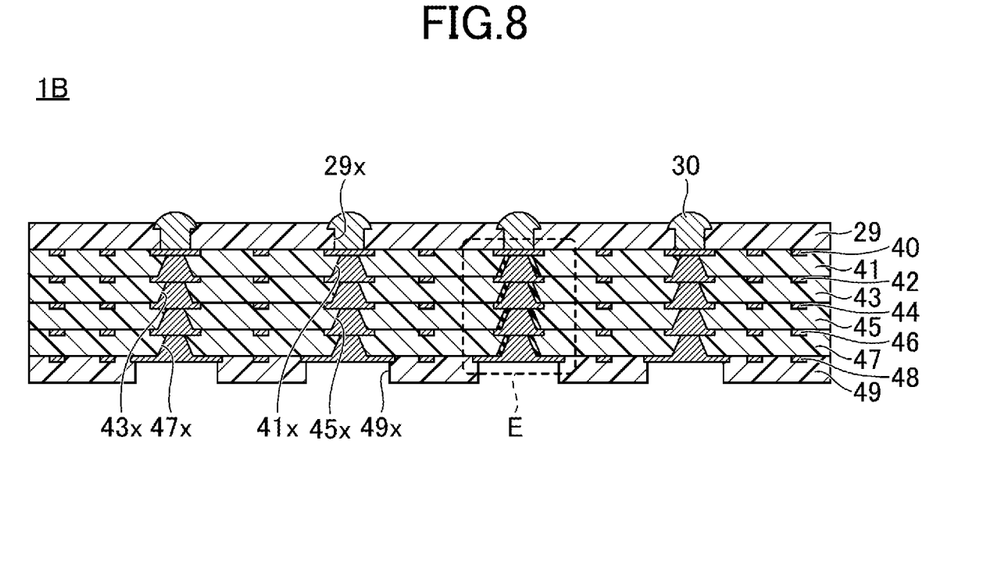
FIG. 8 is a cross sectional view illustrating an example of the wiring board according to a second modification of the first embodiment.

FIG. 8 is a cross sectional view illustrating an example of the wiring board according to the second modification of the first embodiment. As illustrated in FIG. 8, a wiring board 1B differs from the wiring board 1 illustrated in FIG. 1A and FIG. 1B in that no core layer is provided.

More particularly, in the wiring board 1B, the solder resist layer 29 of the wiring board 1 is formed at an uppermost portion of the laminated structure laminated on the other surface 10b of the core layer 10 of the wiring board 1. The solder resist layer 29 of wiring board 1B includes openings 29x exposing portions of the top surfaces of the pads of interconnect layer 40. In addition, the external connection terminals 30 are formed on the top surfaces of the pads of the interconnect layer 40 exposed at the bottoms of the openings 29x. Further, interconnect structures having structures similar to the interconnect structures in the region of the wiring board 1 surrounded by the dashed line B, are laminated in a region of the wiring board 1B surrounded by a dashed line E. Interconnect structures having structures similar to the interconnect structures in the region of the wiring board 1A surrounded by the dashed line D, may be laminated in the region of the wiring board 1B surrounded by the dashed line E.

Accordingly, the laminated structure of the interconnect structures may be provided on the wiring board having the core layer, or on the coreless wiring board having no core layer. Even in the case where the laminated structure of the interconnect structures is provided on the coreless wiring board, the interconnect structure includes the magnetic resin, and the via interconnects penetrating the magnetic resin, thereby enabling the inductor to be formed by the magnetic resin and the via interconnects. For this reason, there is no need to externally connect an inductor component, and it is possible to reduce both the size and cost of the wiring board 1B. Moreover, it is possible to obtain a high inductance value, by laminating a plurality of interconnect structures. Further, because the number interconnect structures to be laminated, that is, the number of levels in which the interconnect structures are provided, can be determined arbitrarily in the wiring board 1B, it is possible to improve the degree of freedom of design for obtaining the required inductance value.

Third Modification of First Embodiment

A third modification of the first embodiment relates to an example of a wiring board having various types of wiring boards. In the third modification of the first embodiment, a description of the same constituent elements as those of the embodiment described above may be omitted.

Figure 9:
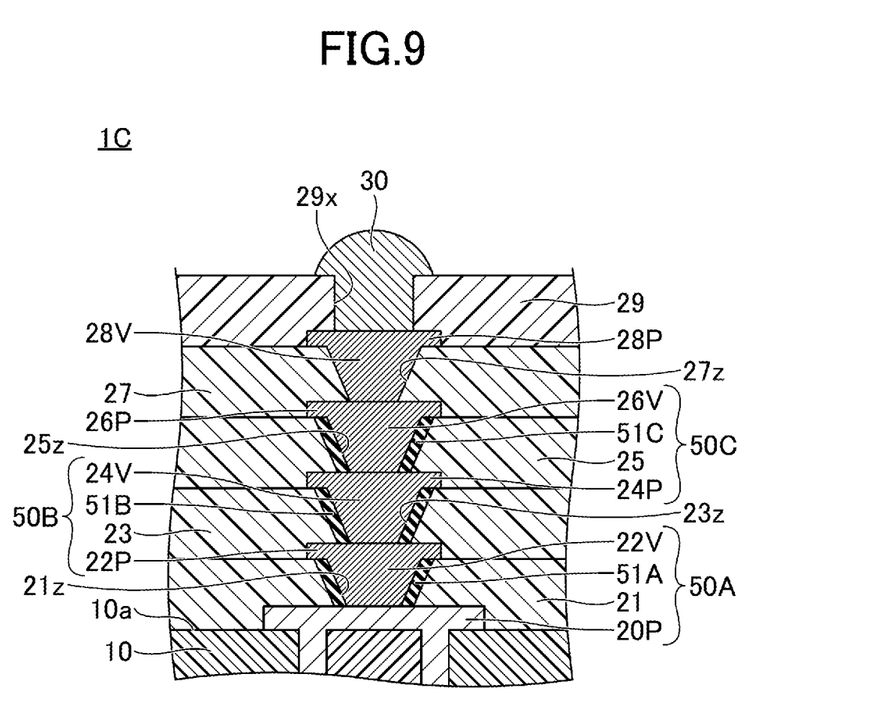
FIG. 9 is a partial cross sectional view illustrating an example of the wiring board according to a third modification of the first embodiment.

FIG. 9 is a partial cross sectional view illustrating an example of the wiring board according to the third modification of the first embodiment, and illustrates a cross sectional view corresponding to FIG. 1B. As illustrated in FIG. 9, a wiring board 1C differs from the wiring board 1 illustrated in FIG. 1B in that the interconnect structure 50D is not laminated on the interconnect structure 50C. In the wiring board 1C, the via interconnects 28V that do not penetrate the magnetic resin, are disposed on the interconnect structure 50C.

Accordingly, the via interconnects penetrating the magnetic resin, and the via interconnects not penetrating the magnetic resin, may coexist and be laminated. It is possible to adjust the inductance value, by forming a portion of the via interconnects that are laminated by the via interconnects that do not penetrate the magnetic resin. The location of the via interconnects that do not penetrate the magnetic resin is not limited to the uppermost level of the laminated structure, and the via interconnects that do not penetrate the magnetic resin may be located in an arbitrary level of the laminated structure. In addition, the via interconnects that do not penetrate the magnetic resin may be disposed in a plurality of levels of the laminated structure.

Application Example of First Embodiment

An application example of the first embodiment relates to an example of a semiconductor device having a semiconductor chip is mounted on the wiring board. In the application example of the first embodiment, a description of the same constituent elements as those of the embodiment described above may be omitted.

Figure 10:
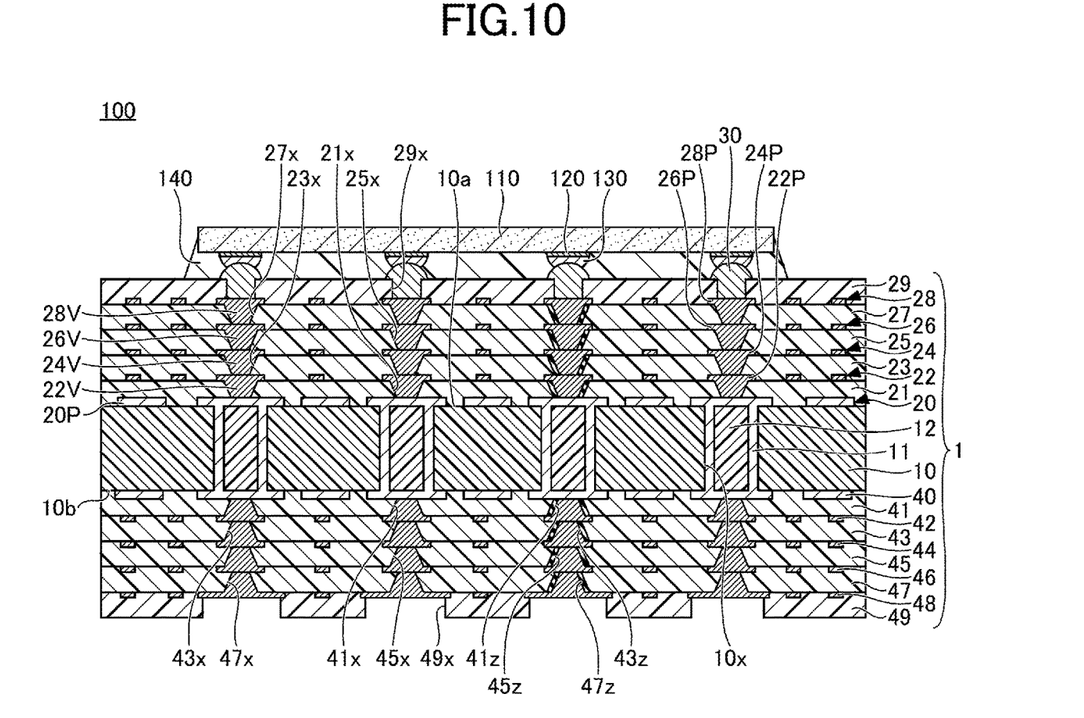
FIG. 10 is a cross sectional view (part 1) illustrating an example of a semiconductor device according to an application example of the first embodiment.

FIG. 10 is a cross sectional view (part 1) illustrating an example of the semiconductor device according to the application example of the first embodiment. As illustrated in FIG. 10, a semiconductor device 100 includes the wiring board 1 illustrated in FIG. 1A and FIG. 1B, a semiconductor chip 110, electrode pads 120, bumps 130, and an underfill resin 140.

The semiconductor chip 110 includes a semiconductor integrated circuit (not illustrated) or the like formed on a thinned semiconductor substrate (not illustrated) made of silicon or the like, for example. The electrode pads 120, electrically connected to the semiconductor integrated circuit (not illustrated), are formed on the semiconductor substrate (not illustrated).

The bumps 130 are formed on the electrode pads 120 of the semiconductor chip 110, and are electrically connected to the pads 28P for external connection of the wiring board 1, via the external connection terminals 30 of the wiring board 1, respectively. The underfill resin 140 is filled between the semiconductor chip 110 and the top surface of the wiring board 1. The bumps 130 are solder bumps, for example. Examples of a material used for the solder bumps include an alloy including Pb, an alloy of Sn and Cu, an alloy of Sn and Ag, an alloy of Sn, Ag, and Cu, or the like, for example. Bumps to be connected to a motherboard or the like may be formed on the bottom surfaces of the pads of the interconnect layer 48 exposed at the bottoms of the openings 49x in the solder resist layer 49.

Figure 11:
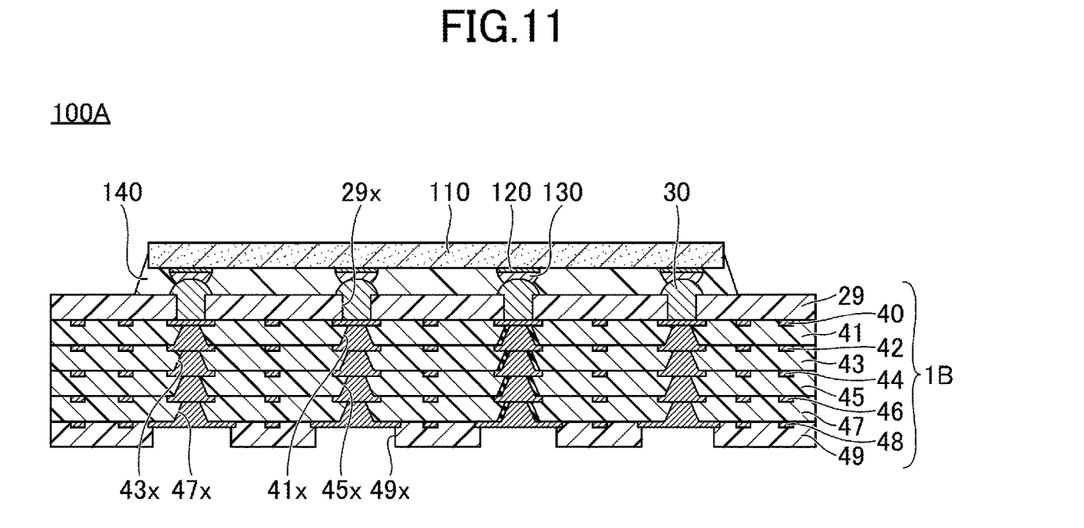
FIG. 11 is a cross sectional view (part 2) illustrating another example of the semiconductor device according to the application example of the first embodiment.

As described above, the semiconductor device can be formed by mounting the semiconductor chip onto the wiring board according to the first embodiment. In the semiconductor device 100, the wiring board 1A may be used in place of the wiring board 1. In addition, the coreless wiring board 1B may be used, as in a semiconductor device 100A illustrated in FIG. 11. FIG. 11 is a cross sectional view (part 2) illustrating another example of the semiconductor device according to the application example of the first embodiment. In each of the semiconductor devices 100 and 100A according to the application examples of the first embodiment, it is possible to improve the effects of noise reduction or the like, because the inductor formed by the laminated structure of the interconnect structures can be disposed near the semiconductor chip.

According to the present disclosure, it is possible to provide a wiring board that can easily vary the inductance value.

Various aspects of the subject-matter described herein may be set out non-exhaustively in the following numbered clauses:

1. A method for manufacturing a wiring board comprising:
    forming an insulating layer covering a pad;
    forming a through hole penetrating the insulating layer and exposing a top surface of the pad;
    forming a magnetic resin filling the through hole;
    forming a via hole penetrating the magnetic resin and exposing the top surface of the pad; and
    forming a via interconnect filling the via hole and electrically connected to the pad.

2. The method for manufacturing the wiring board according to clause 1, further comprising:
    forming a protective insulating layer continuously covering a top surface of the insulating layer and a top surface of the magnetic resin, after the forming the magnetic resin,
    wherein the forming the via hole forms the via hole penetrating the protective insulating layer and the magnetic resin and exposing the top surface of the pad.

3. The method for manufacturing the wiring board according to clause 2, further comprising:
    forming a second pad positioned at the same level as the pad and covered only with the insulating layer;
    forming a second via hole penetrating the protective insulating layer and the insulating layer and exposing a top surface of the second pad, between the forming the protective insulating layer and the forming the via hole; and
    removing a resin residue inside the second via hole using a chemical.

Although the modifications of the embodiment are numbered with, for example, "first," "second," or "third," the ordinal numbers do not imply priorities of the modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A wiring board comprising:
    an interconnect structure including
        a pad;
        an insulating layer covering the pad and including a through hole defined by a wall of the insulating layer;

a magnetic resin disposed on the wall defining the through hole and on the pad inside the through hole; and a via interconnect penetrating the magnetic resin and electrically connected to the pad inside the through hole, wherein:

the via interconnect makes contact with the magnetic resin inside the through hole, and a top surface of the insulating layer coincides with a top surface of the magnetic resin.

2. The wiring board as claimed in claim 1, further comprising:

a plurality of interconnect structures, successively laminated in a plurality of levels, and including the interconnect structure, wherein the pad of the interconnect structure in an upper level and the pad of the interconnect structure in a lower level are electrically connected via the via interconnect of the interconnect structure in the lower level, the via interconnects of the plurality of interconnect structures have portions that overlap one another in a plan view, and the magnetic resins of the plurality of interconnect structures have portions that overlap one another in the plan view.

3. The wiring board as claimed in claim 1, wherein the interconnect structure further includes a protective insulating layer continuously covering the top surface of the insulating layer and the top surface of the magnetic resin, and the via interconnect is electrically connected to the pad by penetrating the protective insulating layer and the magnetic resin.

4. The wiring board as claimed in claim 3, wherein the protective insulating layer is thinner than the insulating layer.

5. The wiring board as claimed in claim 1, further comprising:

a pad for external connection, disposed on the interconnect structure, and electrically connected to the via interconnect of the interconnect structure.

6. The wiring board as claimed in claim 1, further comprising:

a core layer, wherein the interconnect structure is disposed on the core layer.

7. A semiconductor device comprising:

the wiring board as claimed in claim 5; and a semiconductor chip disposed on the wiring board, wherein the semiconductor chip is electrically connected to the pad for external connection.

8. The semiconductor device as claimed in claim 7, wherein the wiring board further includes a core layer, and the plurality of interconnect structures is disposed on the core layer.

9. The wiring board as claimed in claim 1, wherein:

the through hole penetrates the insulating layer and exposes the top surface of the pad inside the through hole, the magnetic resin fills the through hole of the insulating layer, the magnetic resin includes a via hole penetrating the magnetic resin, defined by an inner wall surface of the magnetic resin, and exposing the top surface of the pad inside the via hole, the via interconnect fills the via hole of the magnetic resin, and the magnetic resin makes contact with each of the top surface of the pad, the inner wall surface defining the through hole, and an outer wall surface of the via interconnect.

10. The wiring board as claimed in claim 1, wherein:

the magnetic resin fills the through hole of the insulating layer and makes contact with the wall defining the through hole, the magnetic resin includes a via hole penetrating the magnetic resin, defined by an inner wall surface of the magnetic resin, and exposing the top surface of the pad inside the via hole, and the via interconnect fills the via hole of the magnetic resin and makes contact with the top surface of the pad inside the via hole.

* * * * *